United States Patent
Kahng et al.

(10) Patent No.: US 7,170,300 B2
(45) Date of Patent: Jan. 30, 2007

(54) APPARATUS AND METHOD FOR INSPECTING INTERFACE BETWEEN GROUND LAYER AND SUBSTRATE OF MICROSTRIP BY USING SCATTERING PARAMETERS

(75) Inventors: Sung-Tek Kahng, Daejon (KR); Jong-Won Eun, Daejon (KR); Seong-Pal Lee, Daejon (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 10/917,822

(22) Filed: Aug. 12, 2004

(65) Prior Publication Data

US 2005/0127892 A1    Jun. 16, 2005

(30) Foreign Application Priority Data

Dec. 15, 2003    (KR) .................. 10-2003-0091184

(51) Int. Cl.
*G01R 27/06* (2006.01)
*G01R 27/26* (2006.01)

(52) U.S. Cl. .................. 324/638; 324/765; 324/633; 324/635

(58) Field of Classification Search ................ 324/638, 324/765
See application file for complete search history.

(56) References Cited

U.S. PATENT DOCUMENTS

| | | | | |
|---|---|---|---|---|
| 4,816,767 A | * | 3/1989 | Cannon et al. | 324/601 |
| 5,440,236 A | * | 8/1995 | Schiek et al. | 324/601 |
| 5,781,071 A | * | 7/1998 | Kusunoki | 330/269 |
| 6,137,293 A | * | 10/2000 | Wu et al. | 324/638 |
| 6,573,744 B2 | * | 6/2003 | Tsai | 324/769 |
| 6,650,123 B2 | * | 11/2003 | Martens | 324/601 |
| 6,671,118 B2 | * | 12/2003 | Putnam et al. | 360/68 |
| 2001/0036028 A1 | * | 11/2001 | Putnam et al. | 360/46 |
| 2002/0084514 A1 | * | 7/2002 | Maetani | 257/662 |

FOREIGN PATENT DOCUMENTS

| | | |
|---|---|---|
| KR | 20010112157 | 12/2001 |
| KR | 1020030019526 | 3/2003 |

OTHER PUBLICATIONS

"A Power Amplifier with Efficeincy Improved Using Defected Ground Structure", J. Lim, et al, 2001 IEEE, vol. 11. No. 4, Apr. 2001, pp. 170-172.

"Design of lowpass filters using defected ground structure and compensated microstrip line", Electronics Letters, Oc. 24, 2002, vol. 38, No. 2 pages.

* cited by examiner

*Primary Examiner*—Anjan Deb
(74) *Attorney, Agent, or Firm*—Blakely Sokoloff Taylor & Zafman (57) ABSTRACT

An apparatus and method for detecting a defect on a ground layer of microstrip by using scattering parameters is disclosed. The apparatus includes: a providing unit for providing a signal to the microstrip by changing a frequency of the signal in a predetermined range of frequencies; a detecting unit for detecting scattering parameters of an output signal from the microstrip in response to the frequency of the signal; and an analyzing unit for analyzing the interface based on the scattering parameters.

12 Claims, 9 Drawing Sheets

APPARATUS AND METHOD FOR INSPECTING INTERFACE BETWEEN GROUND LAYER AND SUBSTRATE OF MICROSTRIP BY USING SCATTERING PARAMETERS

FIELD OF THE INVENTION

The present invention relates to an apparatus and a method for inspecting an interface a microstrip; and, more particularly, to an apparatus and a method for detecting a defect of a ground layer of a microstrip by using scattering parameters.

DESCRIPTION OF RELATED ARTS

A microstrip has been frequently and successfully adapted to active devices such as amplifiers, oscillators and passive devices including filters, radiators and feeding systems of microstrip patch antennas.

The microstrip includes a ground metal layer, a dielectric layer called a substrate formed on the ground metal layer, a metal strip is formed on the dielectric layer, an input end formed on one side of the metal strip and an output end formed on the other side of the metal strip. The microstrip receives an input signal of a direct current (DC) or an alternating current (AC) at the input end and outputs an output signal by delaying the input signal within predetermined time through the output end.

In particular, the microstrip of microwave monolithic integrated circuit (MMIC) has drawn much attention from developers of satellite transponders because of benefits of the microstrip such as being planar, light, etc.

For the microstrip to be accepted for satellite use, the microstrip goes through a number of assembly, integration and test (AI & T) procedures and most of microstrip will end up with unwanted performances. After each of the AI & T, the microstrip gets mechanically stressed. Specifically, conditions of test like vibration and shock can do damage to the ground metal layer of the microstrip. The damaged ground metal layer may create defects such as cracks or slots. The defects cause unwanted resonance at a specific frequency range and, thus, degrade the related electric performance. However, there has been no method and apparatus introduced for detecting the defects of the ground metal layer of the microstrip structure.

SUMMARY OF THE INVENTION

It is, therefore, one object of the present invention to provide an apparatus and a method for inspecting a normal microstrip structure based on scattering parameters.

It is another object of the present invention to provide an apparatus and a method for detecting a defect on a ground layer of a microstrip based on scattering parameters of the microstrip.

It is still another object of the present invention to provide an apparatus and a method for detecting a size of a defect on a ground layer of a microstrip based on scattering parameters of the microstrip.

In accordance with one aspect of the present invention, there is provided an apparatus for detecting a defect on a ground layer of a microstrip, the apparatus including: a providing unit for providing a signal to the microstrip by changing a frequency of the signal in a predetermined range of frequencies; a detecting unit for detecting scattering parameters of an output signal from the microstrip in response to the frequency of the signal; and an analyzing unit for analyzing the interface based on the scattering parameters.

In accordance with another aspect of the present invention, there is also provided a method for inspecting an interface between a ground layer and a substrate of a microstrip, the method including the steps of: a) sending a signal to the microstrip by changing a frequency of the signal in a predetermined range of frequencies b) detecting scattering parameters of an output signal, which are varied in response to the frequency of the signal, from the microstrip and generating first graphs of two ports scattering parameters and first smith charts; and c) detecting a defect of the interface by finding an intersection on a trace of the first smith charts and a resonance point on scattering parameter curves of the first graph.

BRIEF DESCRIPTION OF THE DRAWINGS

The above and other objects and features of the present invention will become better understood with regard to the following description of the preferred embodiments given in conjunction with the accompanying drawings, in which.

DETAILED DESCRIPTION OF THE INVENTION

Hereinafter, an apparatus and a method for inspecting an interface between a ground layer and a substrate of a microstrip by using scattering parameter according to the present invention will be described in more detail with reference to the accompanying drawings.

Figure 1:
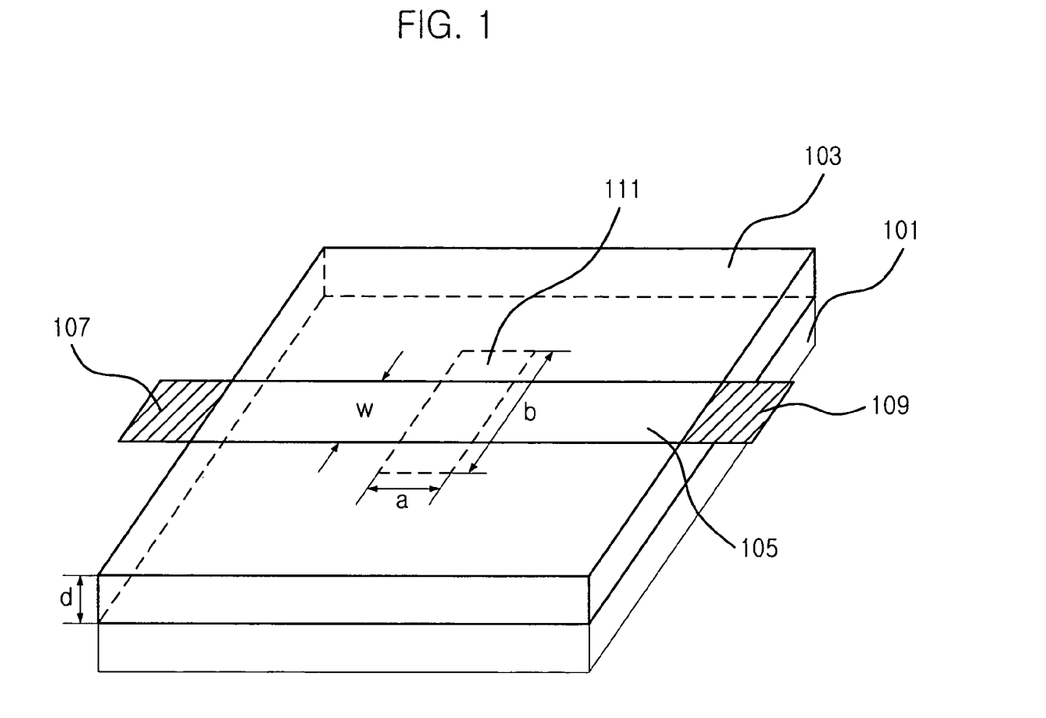
FIG. 1 is a perspective view illustrating a defect on a ground layer of a microstrip.

FIG. 1 is a diagram illustrating a defect on a ground layer of a microstrip.

The microstrip 100 includes a ground layer 101, a substrate 103 having a thickness d formed on the ground layer 101, a metal strip 105 having a width w formed on the substrate 103, an input port 107 formed on one side of the metal strip 105 and an output port 109 formed on other side of the metal strip 105. A defect 111 having a length b and a width a is formed on the ground layer 101 to cause an unwanted resonance at a specific frequency range that degrades overall performance of the microstrip 100.

Figure 2:
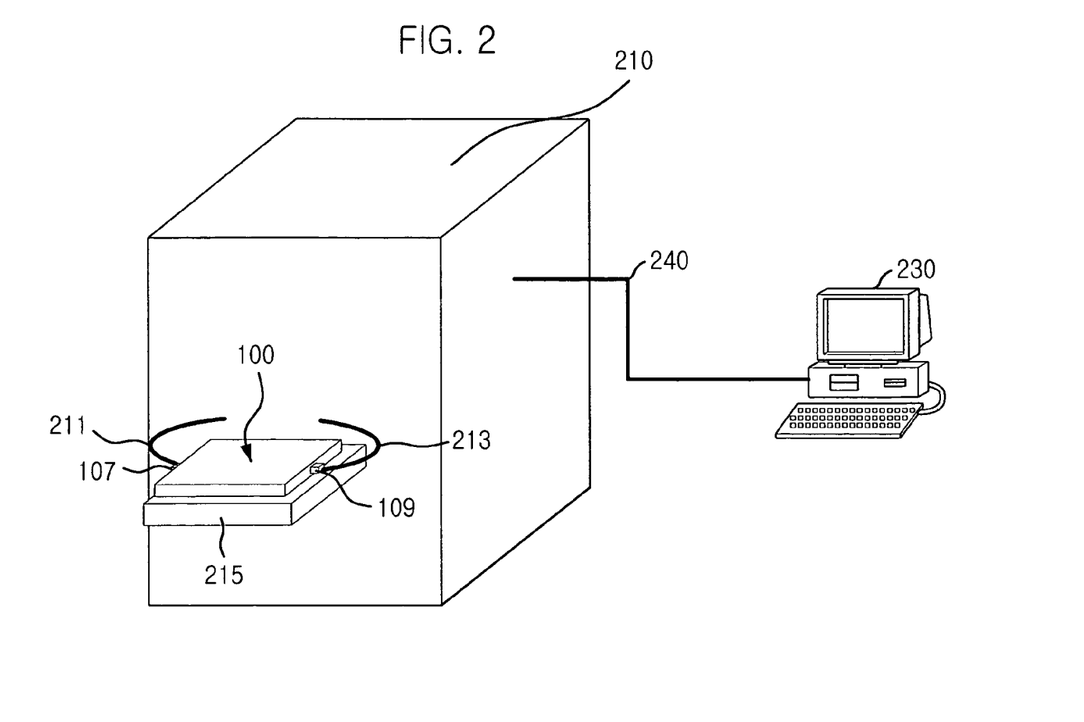
FIG. 2 is a diagram showing an apparatus for inspecting an interface between a ground layer and a substrate of a microstrip in accordance with a preferred embodiment of the present invention.

FIG. 2 is a diagram showing an apparatus for inspecting a ground layer of a microstrip in accordance with a preferred embodiment of the present invention.

As shown in FIG. 2, the apparatus 200 includes a vector network analyzer 210, a computer 230, a general purpose interface bus (GPIB) 240 and a test jig 215.

The microstrip 100 is mounted on the test jig 250 and is electrically connected to the vector network analyzer 210. The microstrip 100 receives signals from the vector network analyzer 210 and generates output signals modified according to a function of the microstrip 100. The output signals of the microstrip 100 are outputted to the vector network analyzer 210.

The vector network analyzer 210 is a device that generally measures various characteristics of the microstrip 100 by detecting scattering parameters of a magnitude, a phase, a reflection, a transmission, an impedance and a time delay. In the preferred embodiment of the present invention, the vector network analyzer 210 detects scattering parameters S11 and S21 of the magnitude to find the defect on the ground layer of the microstrip 100.

The vector network analyzer 220 includes an input cable 211 and an output cable 213. The input cable 211 is connected to an input port 107 of the microstrip 100 and the output cable 213 is connected to an output port 109 of the microstrip 100.

The vector network analyzer 210 provides a signal to the microstrip 100 through the input port 107 by sweeping a frequency of the signal within the predetermined range of frequencies and detects scattering parameters of output signals of the microstrip 100 which are varied in response to the frequencies of the signals through the output port 109. The range of frequencies is determined according a band of frequencies used the microstrip 100.

The vector network analyzer 210 presents graphs of two-port scattering parameters S11 and S21 and smith charts based on the detected scattering parameters varied according to the input signal with the predetermined range of frequencies. The graph of two-port scattering parameter S11 represents a reflectivity of the microstrip 100 and the graph of two-port scattering parameter S21 represents a transmission rate of the microstrip 100. The vector network analyzer 210 deliveries data of the graphs of two-port scattering parameters S11 and S21 and the smith charts to the computer 230 through the GPIB 240 for detecting the defect on the ground layer of microstrip and finding a width and a length of the defect.

The computer 230 is connected to the vector network analyzer 210 through the GPIB 240 and receives data of the graphs of two-ports scattering parameters S11 and S21 and the smith charts for determining whether the defect is on the ground layer of the microstrip 100 by detecting a resonance point, which is called a dip, on the graphs of two-port scattering parameters S11 and S21 and an intersection on a trace of the smith chart.

As mentioned above, the defect such as a slot generates an unwanted resonance at a specific frequency. The intersection of trace on the smith chart and the resonance point of the graphs show that the unwanted resonance occurs at the specific frequency. Therefore, if there is the intersection and the resonance point in the graphs or the smith chart, it assumes that there is the unwanted resonance occurs and the defect is existed on the ground layer.

If the defect is found, a width and a length of defect are obtained by running simulation cases with predetermined values of the width and the length of the defect. For obtaining a size of detected defect, the computer includes an electro magnetic (EM) simulator such as the Ansoft.

The computer 230 runs simulation cases with the predetermined values of the width and the length of the defect by using the EM simulator. The computer 230 obtains graphs of two-port scattering parameters S11 and S21 and smith charts from the simulation results. After obtaining the graphs and smith charts, the graphs and the smith charts are compared to those delivered from the network analyzer 210 for finding graphs of two-ports scattering parameters S11 and S21 and a smith chart having a resonance point and an intersection identical to those shown in the graphs of two-ports scattering parameters S11 and S21 and the smith chart delivered from the vector network analyzer 210. One of predetermined values of the width and the length of defect generating the graphs and the smith charts having identical resonance point and the intersection are selected as a width and a length of the defect existed on the ground layer of the microstrip.

Figure 3:
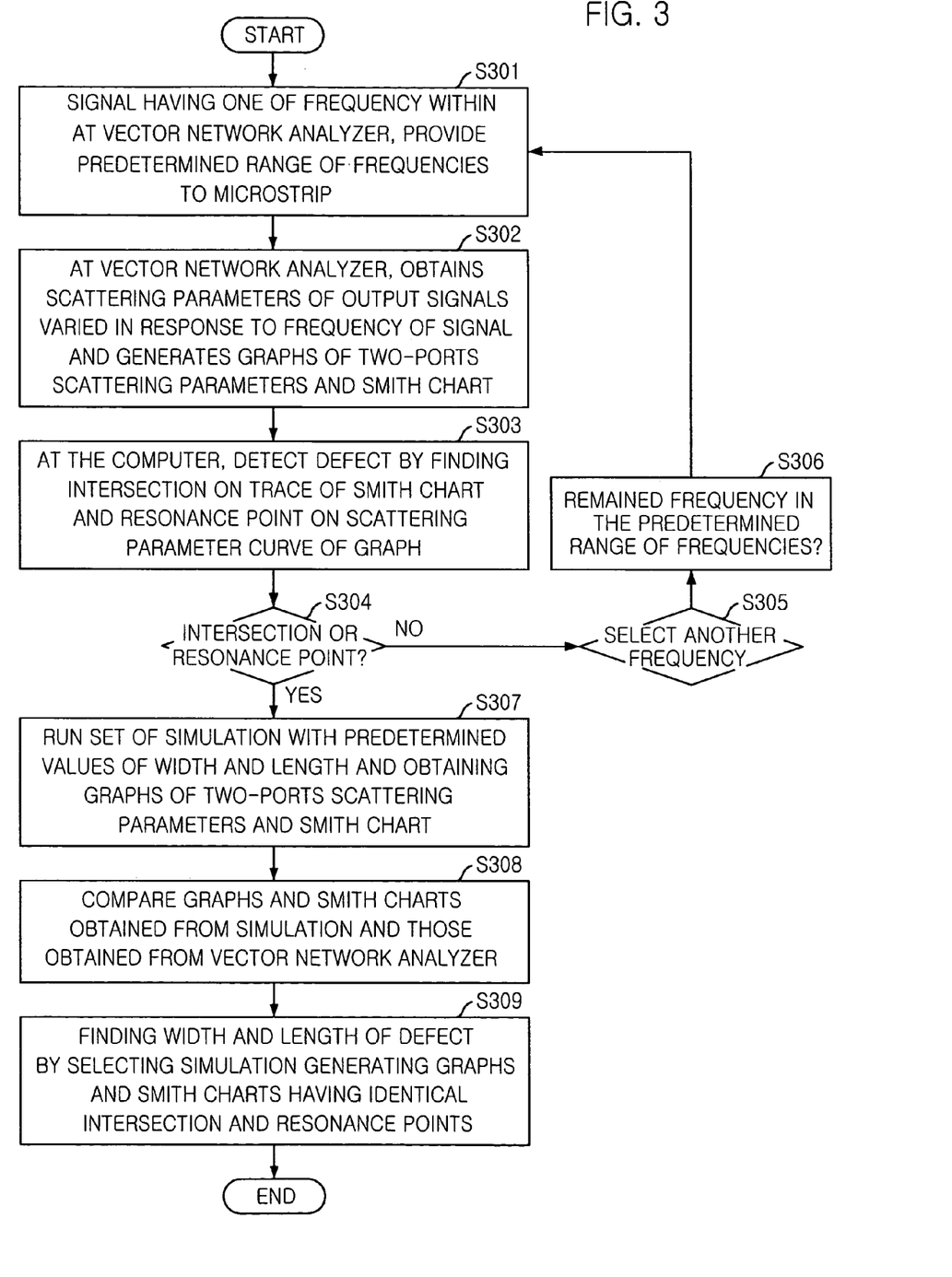
FIG. 3 is a flowchart showing a method for inspecting an interface between a ground layer and a substrate of a microstrip in order to detect a defect on the ground layer and finding a width and a length of the detected defect in accordance with a preferred embodiment of the present invention.

FIG. 3 is a flowchart showing a method for inspecting a ground layer of a microstrip in order to detect a defect on the ground layer and finding a width and a length of the detected defect in accordance with a preferred embodiment of the present invention.

As shown in FIG. 3, at step S301, a microstrip is mounted on a test jig of a vector network analyzer and the vector network analyzer provides signals having one of frequency within a predetermined range of frequencies to the microstrip.

At step S302, the vector network analyzer detects scattering parameters S11 and S21 of magnitude from output signals of the microstrip, which are varied in response to the frequency of the signal, and presents graphs of two-ports scattering parameter S11 and S21 and smith chart based on the detected scattering parameters S11 and S21.

At step S303, a computer receives data of the graphs of two-ports scattering parameters S11 and S21 and the smith chart and determines whether a defect is existed on a ground layer of the microstrip by finding an intersection on a trace of the smith chart or a resonance point, which is called a dip, on scattering parameter curves of the graphs.

At step S304, if there are not intersections or resonance points found and if there remain frequencies in the predetermined range of frequencies at step S305, one of remaining frequencies is selected at step S306 and the signal with the selected frequency at the step S306 is provided for the microstrip at the step S301.

If the remains no frequencies at the step S305, it reports that there is no defect on the ground layer of the microstrip at step S310.

At the step S304, if there is the intersection and the resonance point, a set of simulation cases is run for finding a width and a length of the detected defect at step S307. The set of simulation cases is run with predetermined values $a_n$ of a width and predetermined values $b_n$ of a length of the defect. After running the simulation cases, graphs of two-ports scattering parameters S11 and S21 and smith charts are obtained according to the predetermine values $a_n$ of the width and predetermined values $b_n$ of the length.

At step S308, the graphs and the smith charts obtained by the set of simulation cases are compared to the graph and the smith chart delivered from the vector network analyzer.

At step S309, a width and a length of the defect is determined by selecting graphs and smith charts having the resonance point and the intersection identical with those on graphs and smith chart delivered from the vector network analyzer. The width and the length of the defect are determined as corresponding width and length generating the selected graphs and the smith chart.

Figure 4:
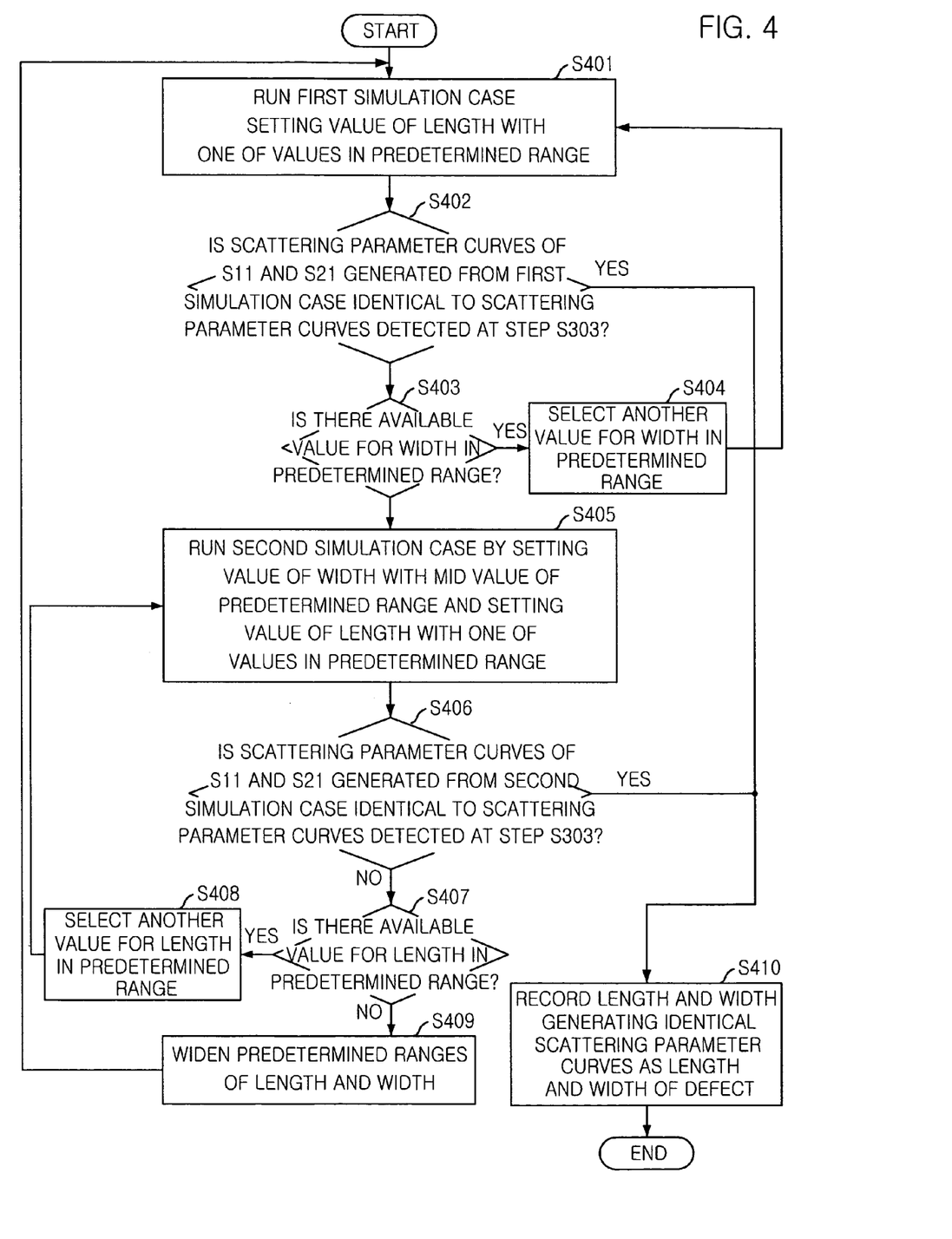
FIG. 4 is a flowchart for explaining the step S307 of FIG. 3 in detail.

FIG. 4 is a flowchart for explaining the step S307 of FIG. 3 in detail.

In the present invention, a set of simulation cases is run after finding a defect on a ground layer of a microstrip for finding a width and a length of the defect. The set of simulation is run by changing predicted values of the width and the length of the defect and scattering parameters S11 and S21 are generated as a result of the set of simulation. Based on the scattering parameters S11 and S21, graphs of two-ports scattering parameters S11 and S21 and smith charts are obtained. The graphs and the smith charts are compared with those delivered from the vector network analyzer. Detailed steps of running simulation are described in below.

At step S401, a first simulation case is run by setting a value of a length b with a fixed value and setting a value of a width a with one of values in a predetermined range $a_n$ for firstly finding a width of the defect detected. The length b and the predetermined range of values $a_n=\{a_1, a_2, a_3, \ldots, a_n\}$ of width a is predetermined by considering a size of a metal strip and a size of a microstrip.

At step S402, It determines whether scattering parameter curves of S11 and S21 generated from the first simulation case identical to the scattering parameter curves detected from a real ground of the microstrip.

If the scattering parameter curves are identical, the values of length b and the width a generating identical scattering parameter curves are determined as a length and a width of the detected defect at step S410.

If the scattering parameter curves are not identical, it determines whether there is any available values for the width a in the predetermine range at step S403.

If there is available values, another value for width a is selected at step S404 and the operation of step S401 is reputedly performed.

If not, a second simulation case is performed by setting the value of the width a as a mid value of the predetermined range and setting a value of the length b with one of values in a predetermined range for the length at step S405.

At step S406, it determines whether a scattering parameter curve of S11 and S21 generated from the second simulation case is identical to the scattering parameter curve delivered from the vector network analyzer for detecting the defect on the ground.

If they are identical at step S406, the values of length b and the width a generating identical scattering parameter curves are determined as a length and a width of the detected defect at step S410.

If not at step S406, it determines whether there is available value for the length b in the predetermined range for the length at step S407.

If there is available value, another value for length b is selected at step S408 and the operation of step S405 is reputedly performed.

If there is not, the values of predetermined ranges for the width b and the length a are determined again in order to widen the ranges of the predetermined values for width b and the length a at step S409 and operation of the step S401 is reputedly performed.

Figure 7A:
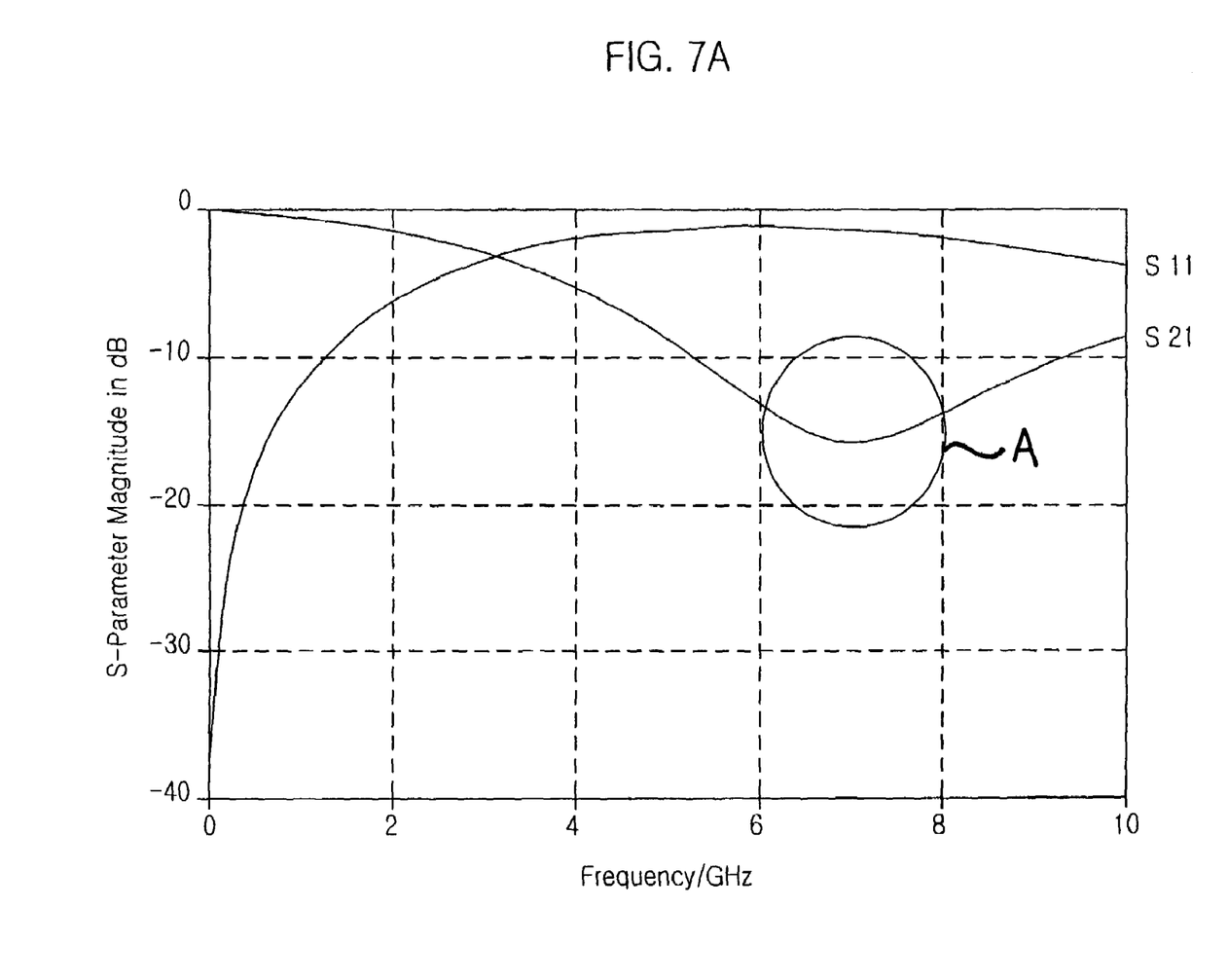
FIGS. 7A and 7B show scattering parameter curves of S11 and S21 obtained from a set of simulation case for finding a value $b_s$ of length among a predetermined range of values $b_n$ of a defect in accordance with a preferred embodiment of the present invention.
Figure 7B:
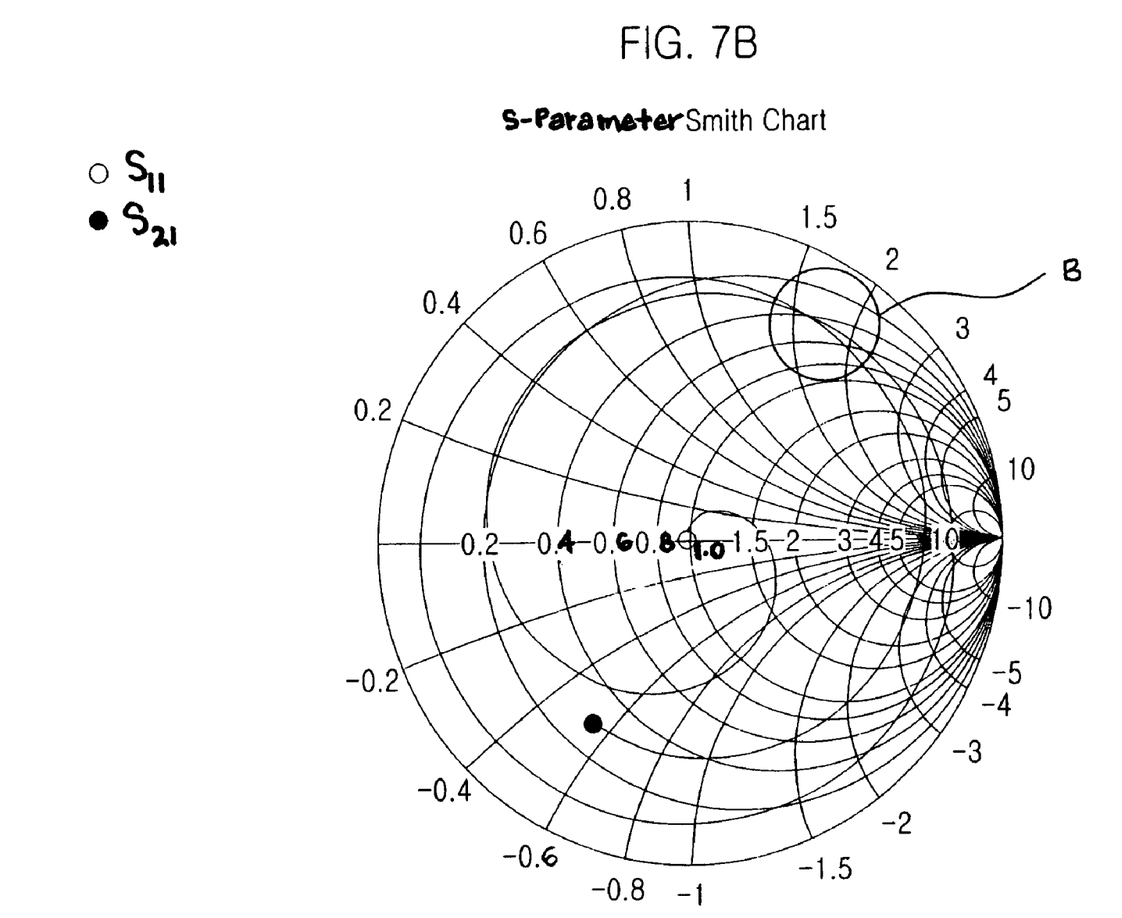

FIGS. 7A and 7B show scattering parameter curves of S11 and S21 and a smith chart obtained from a microstrip having a defect in a ground layer in accordance with a preferred embodiment.

As shown, there is a resonance point A on the scattering parameter curve of S21 and an intersection B on a trace of the smith chart. Therefore, it is determined that the microstrip includes a defect on a ground layer which leads to a resonance at approximately 7 GHz. The obtained scattering parameter curve of S21 and the smith chart are stored and compared with those obtained from simulation cases for finding a width and a length of the defect.

Figure 5A:
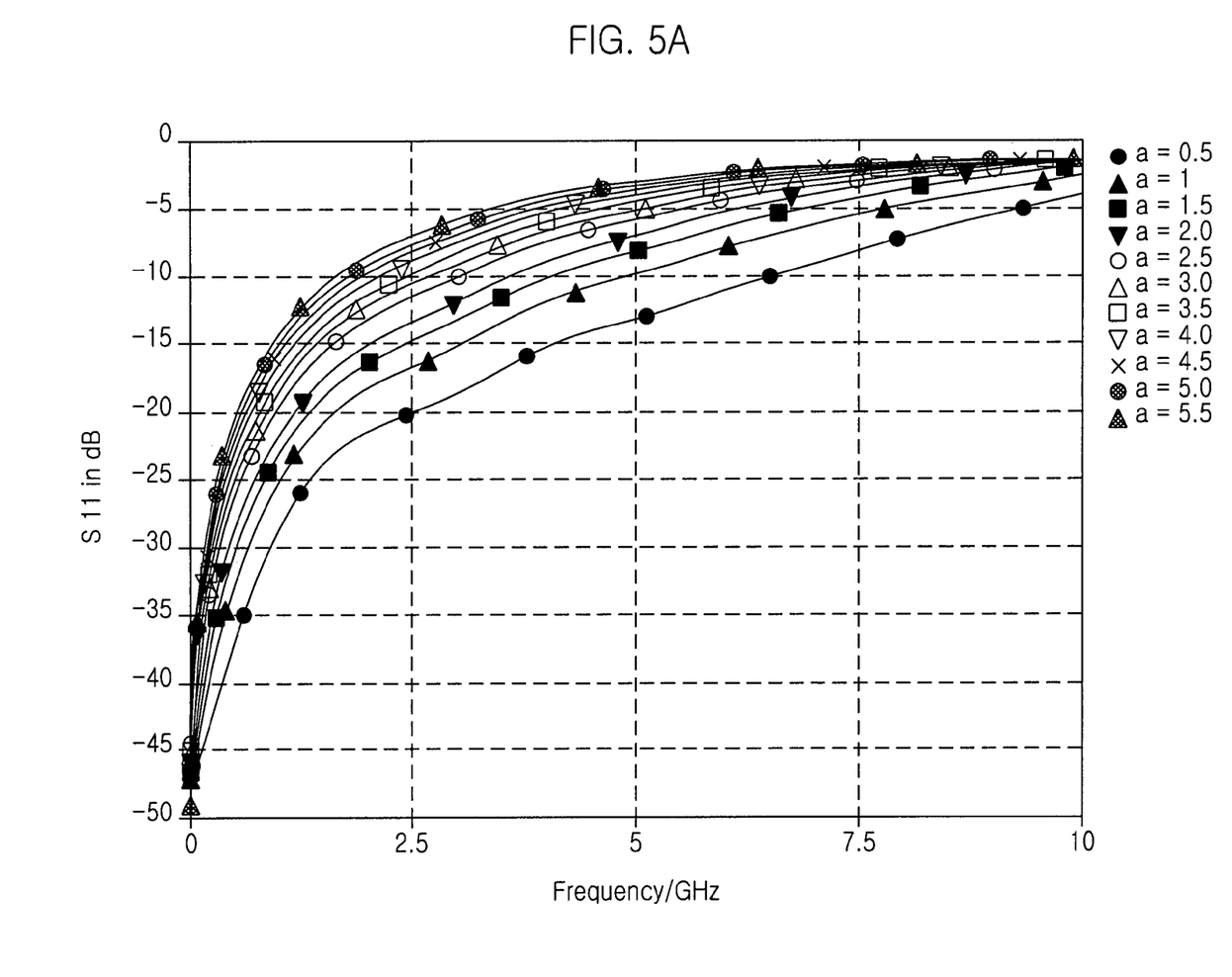
FIGS. 5A and 5B show scattering parameter curves of S11 and S21 and a smith chart obtained from a microstrip having a defect on a ground layer in accordance with a preferred embodiment.
Figure 5B:
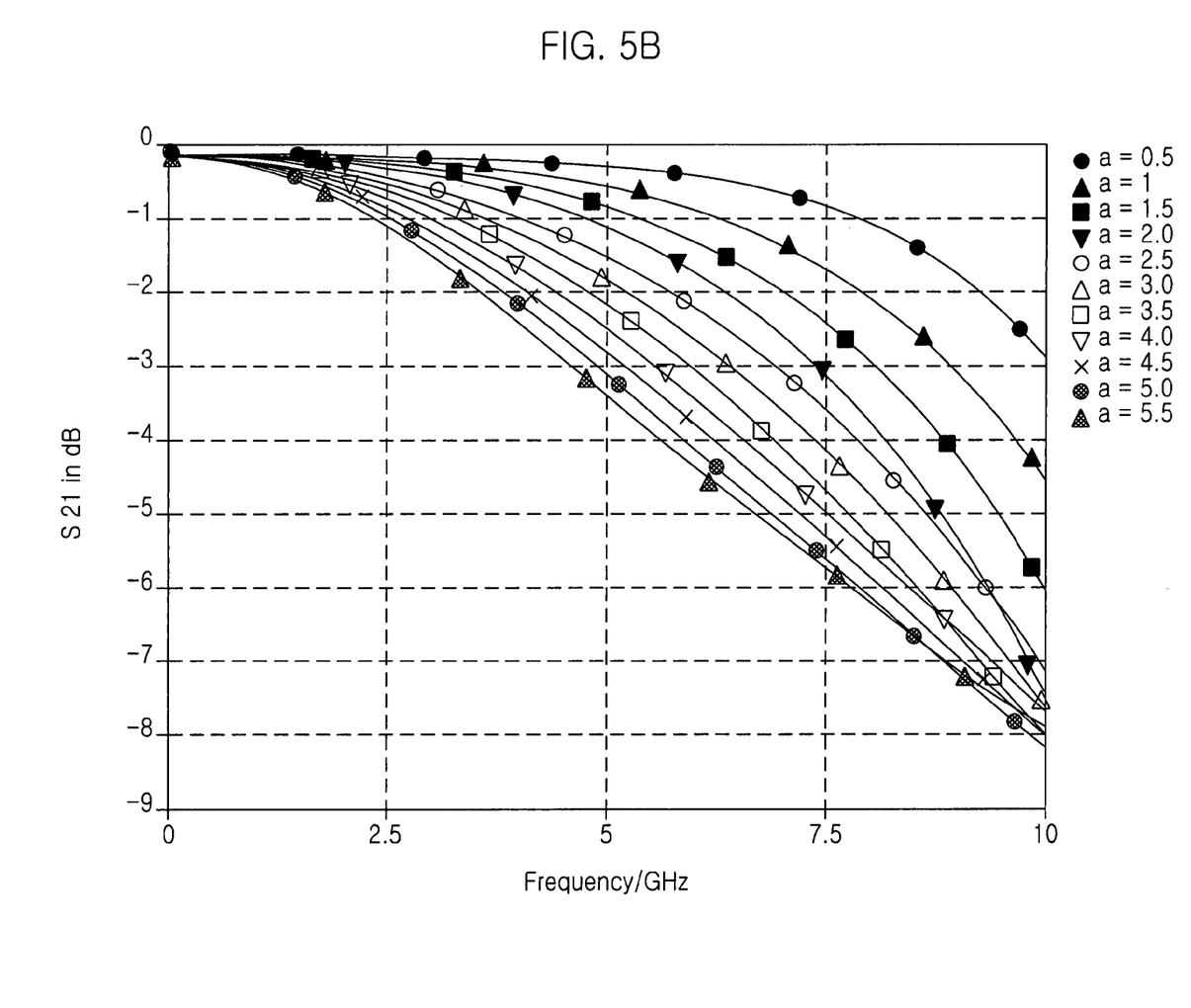

FIGS. 5A and 5B show scattering parameter curves of S11 and S21 obtained from a set of first simulation case for finding a value $a_s$ of width among a predetermine range of values $a_n$ of defect in accordance with a preferred embodiment of the present invention.

As shown, the scattering parameter curves are obtained by running the set of first simulation cases with assumptions including a width of metal strip is 2.4 mm, a thickness of the metal strip is 31 mil, a dielectric constant is 2.2, a fixed value 4.8 mm as the length of defect, which is twice of the width of metal strip and a predetermined range of values for width $a_n=\{0.5, 1, 1.5, 2, \ldots, 5.5\}$.

Since a slope of the scattering parameter curve is higher when a resonance occurs at a specific frequency, the value $a_s$ of width generating the scattering parameter curve of highest slope is selected as a width of the detected defect. Therefore, among the scattering parameter curves, a scattering parameter curve having highest slope obtained from a simulation with a width 5.5 mm is selected in a case of FIGS. 5A and 5B.

Figure 6A:
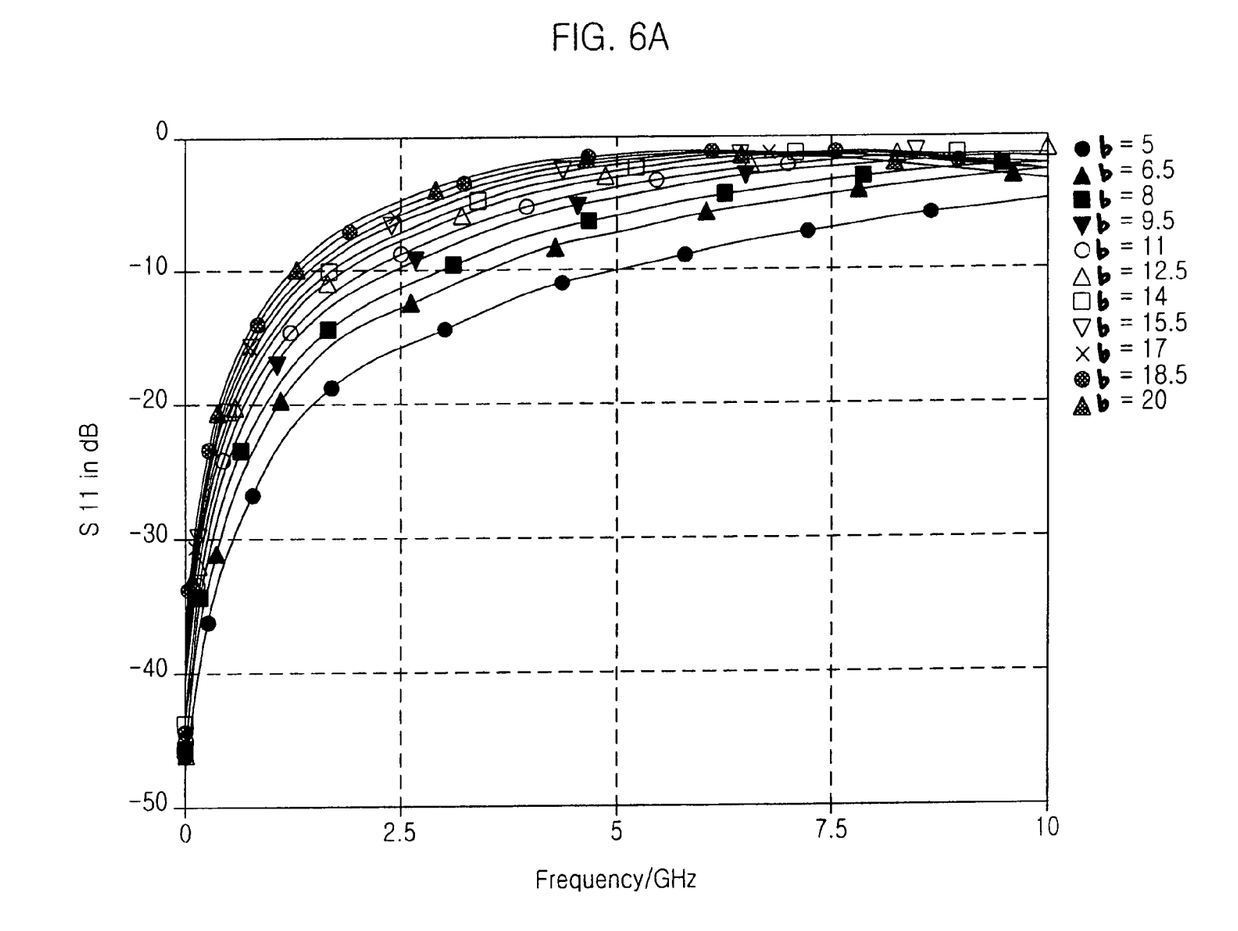
FIGS. 6A and 6B show scattering parameter curves of S11 and S21 obtained from a set of simulation cases for finding a value $a_s$ of width among a predetermine range of values $a_n$ of a defect in accordance with a preferred embodiment of the present invention.
Figure 6B:
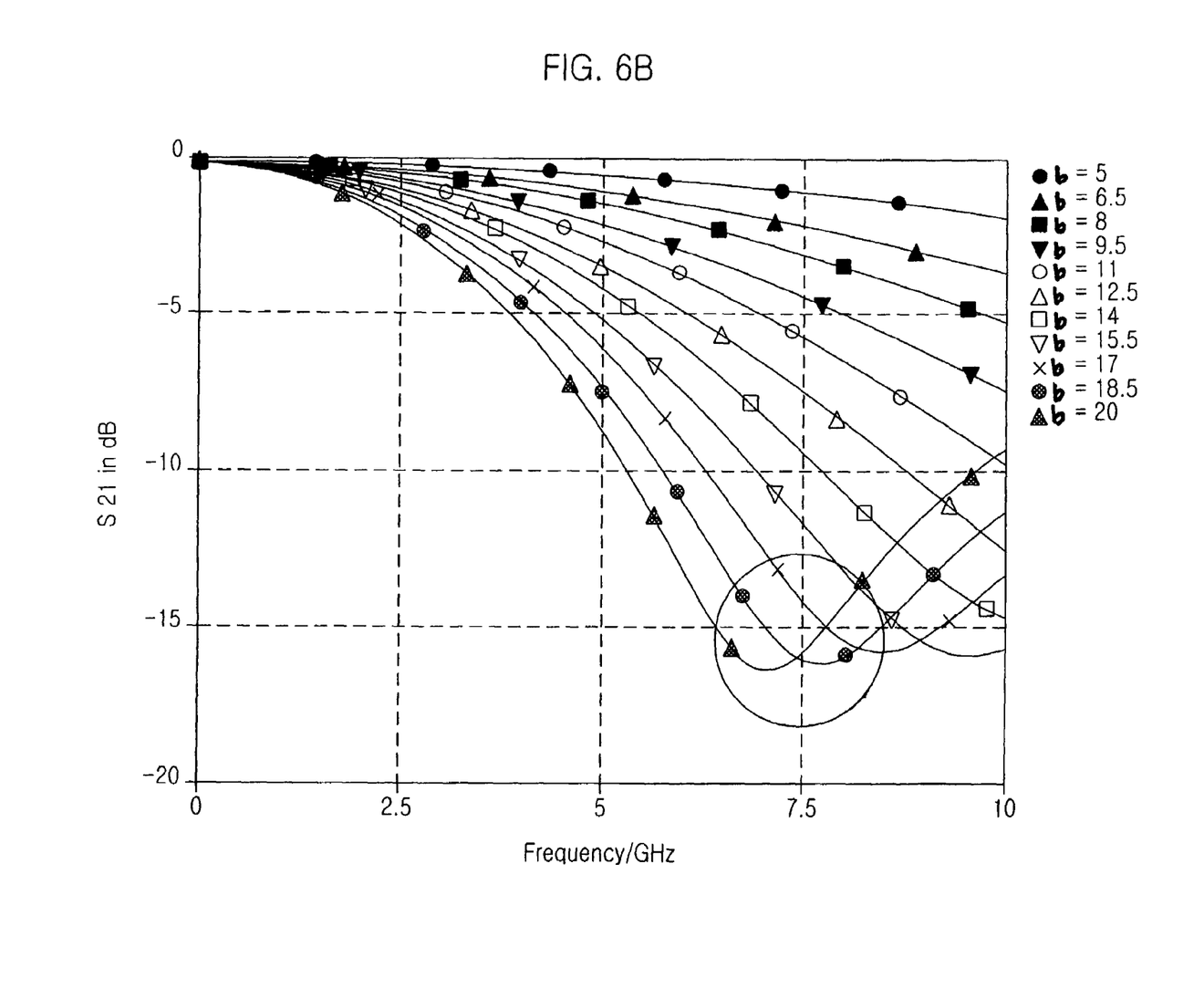

FIGS. 6A and 6B show scattering parameter curves of S11 and S21 obtained from a set of simulation cases for finding a value $b_s$ of length among a predetermined range of values $b_n$ of defect in accordance with a preferred embodiment of the present invention.

As shown, the scattering parameter curves are obtained by running the set of second simulation cases with assumptions including a width of metal strip is 2.4 mm, a thickness of the metal strip is 31 mil, a dielectric constant is 2.2, a set of lengths $b_n=\{5, 6.5, 8, 9.5, 11, 12.5, 14, 15.5, 17, 18.5, 20\}$.

Since a resonance point on the scattering parameter curves of S21 means a resonance occurring at a specific frequency, the scattering parameter curves of S21 including resonance points are selected and correspondence lengths of the scattering parameter curves including resonance points are selected. The selected scattering parameter curves are compared with those delivered from the vector network analyzer for detecting length b of the defect on the ground layer of the microstrip.

The above mentioned method can be implemented as a set of instructions and the set of instructions can be stored in a computer readable recoding medium such as a floppy disk, a ROM, a RAM, a CD-ROM, a hard-disk and an optical magnetic disk.

As mentioned above, the present invention can detect a defect generating an unwanted resonance on a ground layer of the microstrip based on scattering parameters of S11 and S21 and smith chart in order to prevent degrade of performance of the microstrip.

The present application contains subject matter related to Korean patent application No. KR 2003-0091184, filed in the Korean patent office on Dec. 15, 2003, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. An apparatus for inspecting an interface between a ground and a substrate in a microstrip, the apparatus comprising:

means for providing a signal to the microstrip by changing a frequency of the signal in a predetermined range of frequencies;

means for detecting scattering parameters of an output signal from the microstrip in response to the frequency of the signal; and means for analyzing the interface based on the scattering parameters, wherein the analyzing means detects a defect of the interface by generating graphs of two-ports scattering parameters and a smith chart based on the scattering parameters and determining whether the defect exists in the interface by finding a resonance point in the graphs or an intersection on a trace of the smith chart.

2. The apparatus of claim 1, wherein the predetermined range of frequencies are determined based on a band of frequencies used in the microstrip.

3. The apparatus of claim 1, wherein the scattering parameters are scattering parameters of a magnitude.

4. The apparatus of claim 3, wherein the scattering parameters are S11 representing a reflectivity and S21 representing a transmission rate.

5. The apparatus of claim 1, wherein the analyzing means includes:

means for storing the scattering parameters detected by said detecting means; and mean for finding a width and a length of the detected defect by running a set of simulation cases generating scattering parameters based on predetermined values of a length and a width of the detected defect and comparing the scattering parameters generated by the simulation cases and the scattering parameters stored in the storing means.

6. The apparatus of claim 5, wherein the finding means runs the set of simulation cases by changing the predetermined values of the length and the width, obtains scattering parameters, which are varied according to the predetermined values of the length and the width, from the set of simulation cases, generates simulated graphs of two-ports scattering parameters of S11 and S21 and simulated smith charts and determines the width and the length of the detected defect by comparing the simulated graphs and the simulated smith charts with graphs of two-ports scattering parameters and a smith chart generated based on the scattering parameters stored at said storing means.

7. The apparatus of claim 6, wherein the finding means determines the width and the length by selecting one of predetermined values of the length and the width generating the simulated graphs and the simulated smith charts including resonance points and intersections identical with the graphs of two-ports scattering parameters and the smith chart generated based on the scattering parameters stored at said storing means.

8. A method for inspecting an interface between a ground and a substrate in a microstrip, the method comprising the steps of:

a) providing a signal to the microstrip by changing a frequency of the signal in a predetermined range of frequencies b) detecting scattering parameters of an output signal, which are varied in response to the frequency of the signal, from the microstrip and generating first graphs of two ports scattering parameters and first smith charts; and c) detecting a defect of the interface by finding an intersection on a trace of the first smith charts and a resonance point on scattering parameters curves of the first graphs.

9. The method of claim 8, further comprising the steps of:

d) running a set of simulation with predetermined values of a width and a length of the detected defect and generating second graphs of two-ports scattering parameters and second smith chart by obtaining scattering parameters from the set of simulation;

e) comparing the second graphs and the second smith charts with the first graphs and the first smith chart; and f) determining the width and the length of the defect by selecting one of predetermined values of the width and the length generating second graph and smith chart having identical resonance points and intersections.

10. The method of claim 9, wherein the step d) includes the steps of:

d-1) running a first set of simulation by setting the length with a fixed value and changing a value of the width in a predetermined range of predicted width values for finding the width of the defect;

d-2) obtaining a first set of scattering parameter curves of S11 and S21 varied according to the predicted width values of the width;

d-3) selecting one of scattering parameter curves having highest slope and determining the width of the detected defect by selecting one of predicted width values generating the selected scattering parameter curves;

d-4) running a second set of simulation cases by setting the width of the detected defect with the selected one of predicted width values at step d-3) and changing a value of the length in a predetermined range of predicted length values for finding the length of the defect; and d-5) obtaining a second set of scattering parameters S11 and S21 from the second set of simulation cases and generating the second graphs of two-ports scattering parameters and the second smith charts based on the second set of scattering parameters.

11. The method of claim 8, wherein the scattering parameters are scattering parameters of a magnitude.

12. The method of claim 11, wherein the scattering parameters are S11 representing a reflectivity and S21 representing a transmission rate.

* * * * *